United States Patent [19]

Bowers

[11] Patent Number: 4,471,321
[45] Date of Patent: Sep. 11, 1984

[54] INPUT CURRENT COMPENSATION CIRCUIT FOR SUPERBETA TRANSISTOR AMPLIFIER

[75] Inventor: Derek F. Bowers, Santa Clara, Calif.

[73] Assignee: Precision Monolithics, Inc., Santa Clara, Calif.

[21] Appl. No.: 450,530

[22] Filed: Dec. 17, 1982

[51] Int. Cl.³ .............................................. H03F 3/45
[52] U.S. Cl. .................................... 330/261; 330/257
[58] Field of Search ............... 330/252, 257, 261, 288; 323/315, 316

[56] References Cited

U.S. PATENT DOCUMENTS 4,380,739 4/1983 Velo .................................... 330/257

Primary Examiner—James B. Mullins
Assistant Examiner—G. Wan
Attorney, Agent, or Firm—Koppel & Harris

[57] ABSTRACT

An improved input current compensation circuit is provided for a superbeta transistor amplifier. The circuit has a pair of compensation transistors which simulate the amplifier transistors and support a base current which is mirrored back to the amplifier circuit to cancel the input currents thereof. The compensation transistors are supplied with base current by a control transistor. A special voltage control circuit is provided to establish controlled collector-emitter voltages for the compensation transistors independent of the control transistor, thereby decoupling the compensation transistors from the uncertain effects of the control transistor's base-emitter voltage. The control circuit is connected from the collector of one compensation transistor to the emitter of the other, and is provided with primary and secondary current sources to establish a current flow that sets up a desired bias for the control transistor and results in a near exact cancellation of input bias current. The application of the control circuit to both differential and operational amplifiers is illustrated.

21 Claims, 4 Drawing Figures

INPUT CURRENT COMPENSATION CIRCUIT FOR SUPERBETA TRANSISTOR AMPLIFIER

BACKGROUND OF THE INVENTION

1. Field of the Invention

This invention relates to electric amplifier circuits, and more particularly to amplifiers employing superbeta transistors.

2. Description of the Prior Art

"Superbeta transistors" are provided with very lightly doped bases or have their emitters driven heavily into their bases in order to achieve high gains, typically in the order of 1,000 –5,000. Amplifiers with superbeta transistors are capable of achieving a higher degree of amplification than would otherwise be attainable. However, the use of such transistors introduces certain control problems that are not present with lower gain transistors. An accurate mechanism to compensate for amplifier input bias currents has been a particular source of concern.

FIG. 1 shows a typical prior art instrumentation amplifier with conventional transistors and a known input current compensation circuit. The amplifier consists of amplifying transistors Q1 and Q2 with inputs 1 and 2 connected respectively to their bases, current sources I1 and I2 providing current respectively to Q1 and Q2, and resistor R connected across the emitters of the two transistors. The transistor emitters are shown connected to a voltage-to-current converter 4, while their collector outputs may be connected to a second amplifier stage. The base currents of Q1 and Q2 introduce undesirable amplifier input currents. In order to provide a compensation current which eliminates the effects of the input bias currents, an additional transistor Q3 identical to Q1 and Q2 is provided. A current source I3, which is equal to both I1 and I2, is connected to the emitter of Q3 so that the current through Q3 will be approximately equal to that through Q1 and Q2, with the collector of Q3 connected to a positive voltage bus.

The base of Q3 is connected to a current mirror consisting of common base connected transistors Q4, Q5 and Q6. Q6 is diode-connected to provide the basecurrent of Q3, while Q4 and Q5 are respectively connected to inputs 1 and 2. Since Q1, Q2 and Q3 are matched and operate at substantially the same emitter currents, their base currents are approximately equal. The base current of Q3 is reflected back through the current mirror and is combined with the base currents of Q1 and Q2. The result is an approximate cancellation of input currents.

The circuit of FIG. 1 contains undesirable "slow discharge" node. Also, a problem can arise if Q1 and Q2 are replaced by superbeta transistors, since the collector breakdown of such devices is only a few volts. A prior art circuit which attempts to solve this problem is shown in FIG. 2. This circuit is an extension of one employed in the OP-27 operational amplifier produced by Precision Monolithics, Inc. of Santa clara, Calif., the assignee of this application. The circuit substantially overcomes the collector breakdown problem of amplifier transistors Q1 and Q2 noted above by the addition of voltage limiting transistor circuits Q7, Q8, Q9, and Q10, Q11, Q12 connected across the collector-emitter circuits of Q1 and Q2, respectively. Q8 and Q11 are respectively connected in series with Q1 and Q2 and their respective current sources I1 and I2. The other transistors in the voltage limiting circuits are connected to add two base-emitter drops between the bases of Q8 and Q11 and the emitters of Q1 and Q2, respectively. A second set of current sources I4 and I5 respectively supply current to the bases of Q8 and Q11 and to the remainder of the voltage limited circuitry, thereby maintaining the collector-base voltages of Q1 and Q2 at close to zero volts.

A pair of compensation transistors Q13 and Q14 perform a function comparable to that of Q3 in FIG. 1. The bases of Q13 and Q14 are connected in common and, when current is drawn through these compensation transistors by emitter connected current sources I6 and I7, the magnitudes of which are equal to I1 and I2, a bias current flows into Q13 and Q14 to compensate for the input base current of Q1 and Q2. A control transistor Q15 is connected with its collector-emitter circuit between the bases of Q13, Q14 and Q6 of the current mirror to control the base potentials of Q13 and Q14.

An output for a second amplifier stage is provided from transistors Q16 and Q17 which have their collectors connected together, their bases connected respectively to the outputs of I1 And I2, and their emitters connected to the collectors of Q13 and Q14 through transistors Q18 and Q19, respectively. The latter two transistors have a common base connection and maintain the collector-base voltages of Q13 and Q14 close to zero volts, as the voltage limiting circuits described above do for Q1 and Q2. The circuit of FIG. 2 has been found to resolve the collectors breakdown problem. However, difficulties have been encountered in making the circuit work accurately because the very low Early voltage of the superbeta transistors (defined as output impedance x collector current) causes the base current to vary significantly with changes in collector-base voltge. In theory this could be overcome by adjusting the potential between the biases for Q15 and Q18, Q19 until the collector-base voltages of Q13 and Q14 match those of Q1 and Q2. In practice, however, this is quite difficult to accompolish because the optimum bias voltage is a function of the Q15 base-emitter voltage, which is poorly defined since the base currents of Q13 and Q14 are not precisely known. The low initial Early voltage of the superbeta transistors thus introduces errors in the input current compensation. It is the circuit of FIG. 1 which has this problem.

SUMMARY OF THE INVENTION

In view of the above problems associated with the prior art, the object of the present invention is the provision of a novel and improved input current compensation circuit for an amplifier employing superbeta transistors, which circuit achieves a high degree of accuracy despite the transistors' Early voltage, and which also avoids slow discharge notes.

In the accomplishment of these and other objects of the invention, an input current compensation circuit of the type illustrated in FIG. 2 is improved by the addition of a multi-transistor voltage control circuit connected across the compensation transistors to control the collector-emitter voltages thereof. The voltage control circuit is matched with the voltage limiting circuit for the amplifier transistors. A current source arrangement is matched with the current source for the voltage limiting circuit and connected to induce a current flow through the voltage control circuit such that the collector-base voltages of the superbeta transistors and the compensation transistors are substantially equal, thereby establishing an accurate input current cancellation for the amplifier.

In a preferred embodiment, the voltage control circuit is connected from the collector of one compensation transistor to the emitter of the other compensation transistor. Each of the transistors in the voltage control circuit is matched with a respective transistor in the voltage limiting circuit, and the currents through the voltage control circuit are directed so as to establish a voltage-current relationship in the compensation transistors which is reflected back to the amplifier to accurately cancel the amplifier input bias currents. In so doing, the collector-emitter voltages of the compensation transistors are maintained at a level independent of the base-emitter voltage of the control transistor, thereby eliminating variations in the compensation current due to variations in the base-emitter voltage of the control transistor.

These and other features and objects of the control transistor.

These and other features and objects of the invention will be apparent to those skilled in the art from the following detailed description of the preferred embodiments, taken together with the accompanying drawings, in which:

DETAILED DESCRIPTION OF PREFERRED EMBODIMENTS

Figure 1:
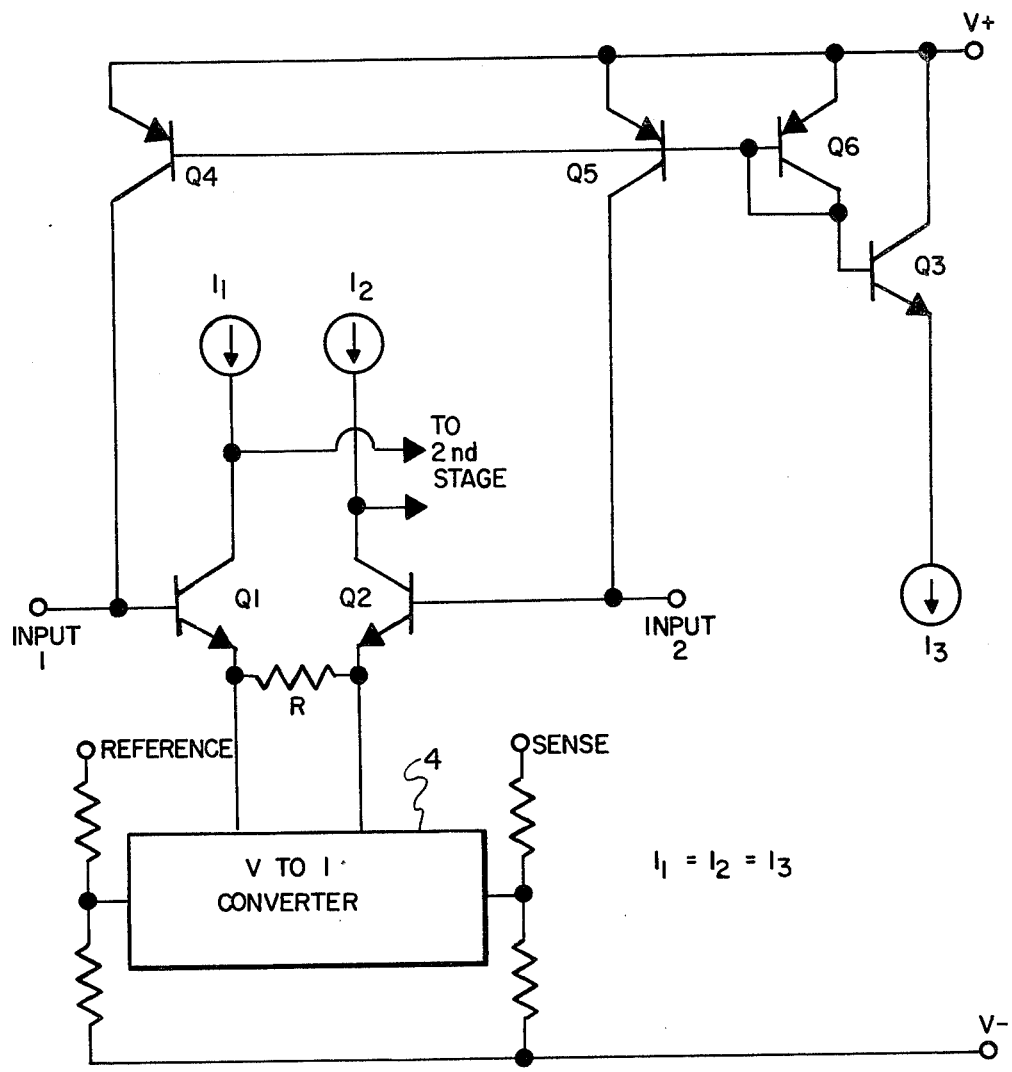
FIG. 1 is a schematic diagram of a prior art amplifier circuit employing ordinary gain transistors and a conventional input compensation circuit.
Figure 2:
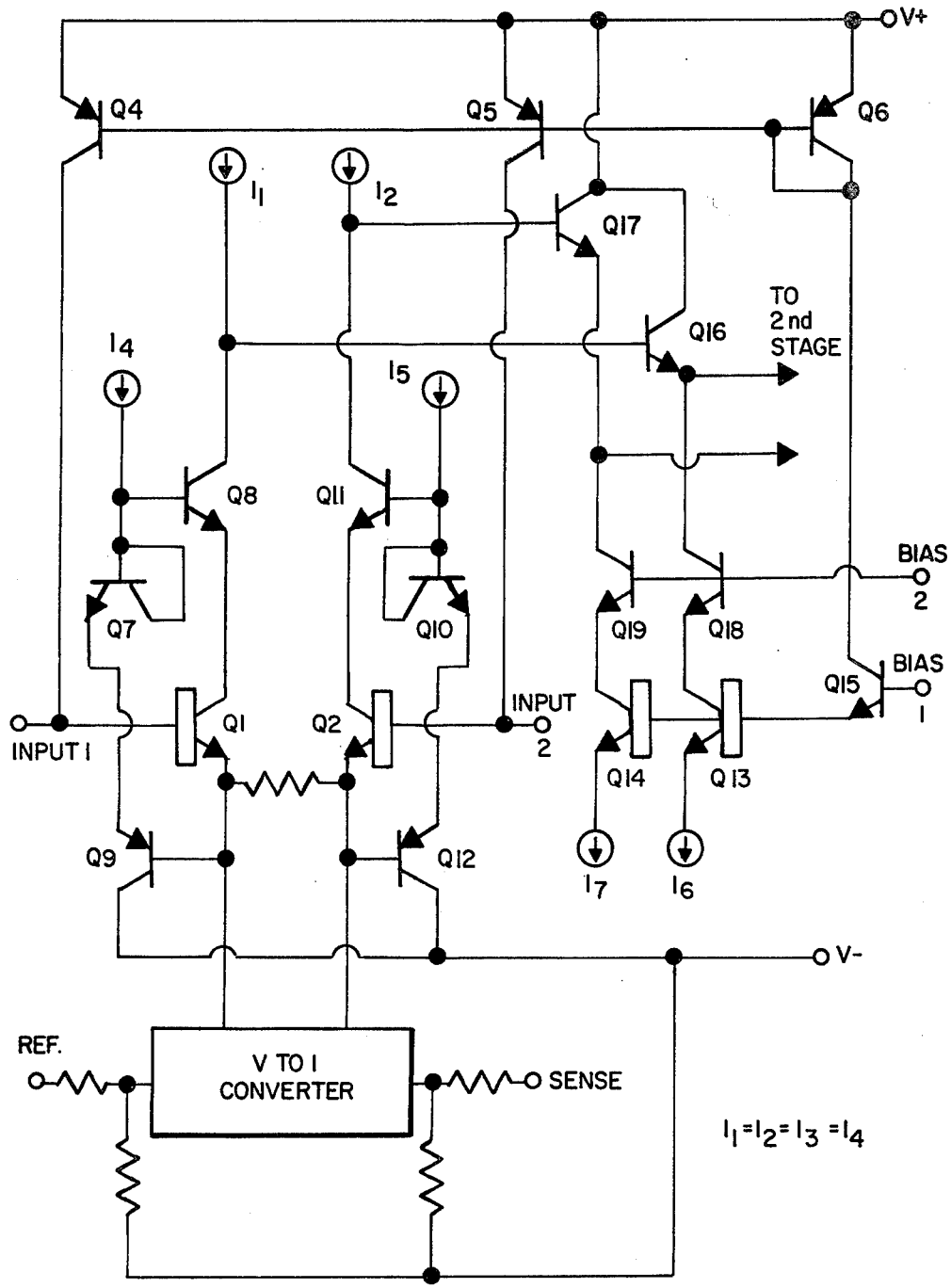
FIG. 2 is a schematic diagram of a prior art superbeta transistor amplifier circuit with input current compensation.
Figure 3:
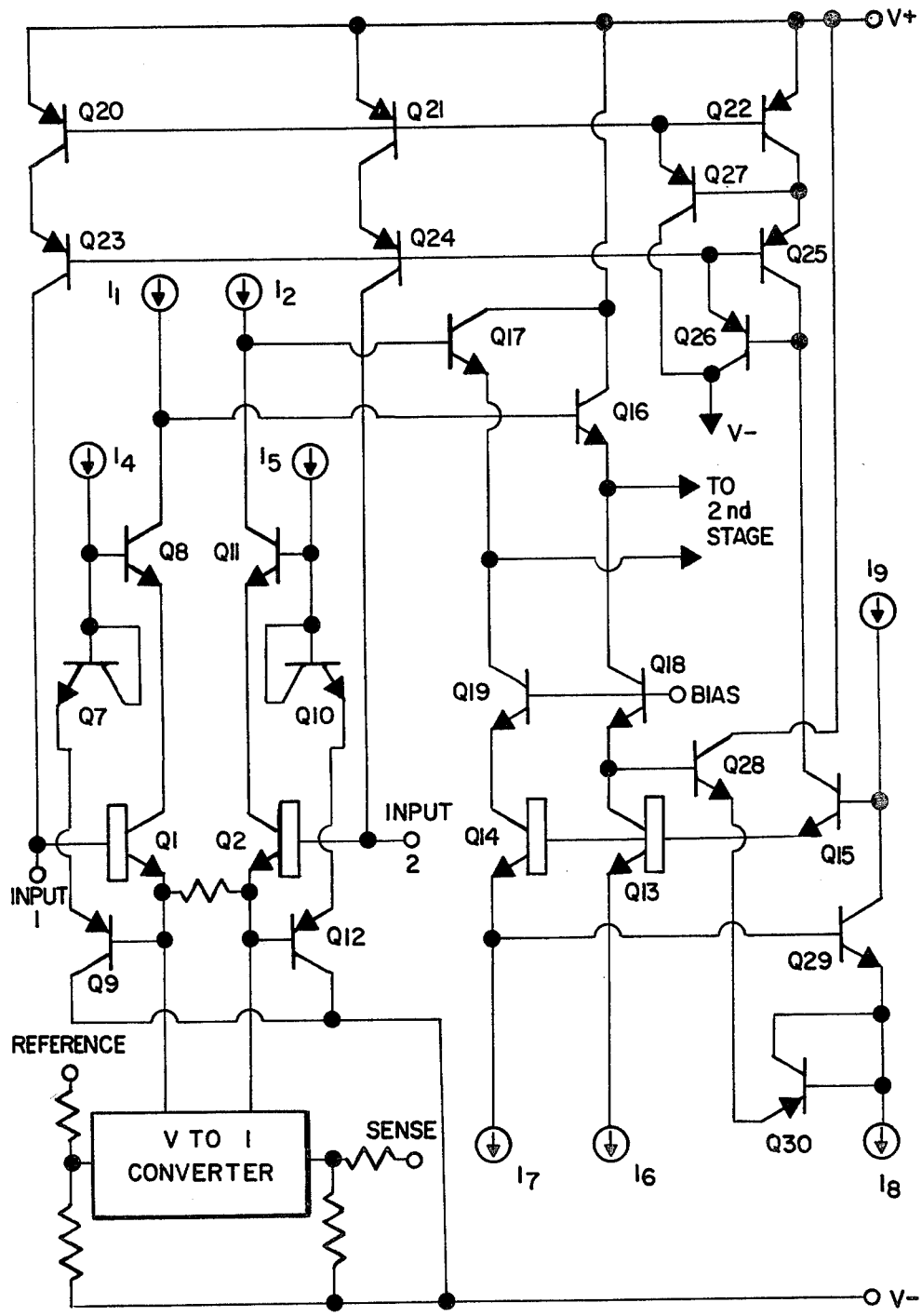
FIG. 3 is a schematic diagram of the improved compensation circuit of the present invention as applied to a differential amplifier.

A preferred embodiment of the invention is shown in FIG. 3. In this figure the same reference numerals are retained from the previous figures of prior art circuits for common elements. While connections between specific transistors in both this specification and the appended claims are described in terms of the transistor polarities shown in the accompanying drawings, it should be understood that the invention is equally applicable to transistors of opposite polarity. Accordingly, a reference to a "collector" or "emitter" should not be taken as limiting, but only as illustrative of a particular transistor polarity; these terms may be interchanged as necessary for transistors of opposite polarity.

The amplifier portion of the circuit is interconnected with the input current compensation portion of the circuit by an improved current mirror formed by transistors Q20 -Q27. This mirror circuit, in which the collector voltages of Q23, Q24 and Q25 are kept the same so as to increase the mirror's accuracy, was employed in a prior art device and forms no part of the present invention.

In order to overcome the very low Early voltage problem mentioned above, a special voltage control circuit is provided for the compensation transistors Q13 and Q14 in order to effectively decouple the collector-emitter voltages of the compensation transistors from the uncertain base-emitter voltage of control transistor 15. This is accomplished by means of a feedback circuit, consisting of transistors Q28, Q29 and Q30 and an associated current source network, which controls the base voltage of control transistor 15 and forces the collector-emitter voltages of compensation transistors Q13 and Q14 to predetermined values.

The voltage control circuit establishes a series of three base-emitter voltage steps between the collector of one compensation transistor Q13 and the emitter of the other compensation transistor Q14, two of the steps being positive and a third negative. This series of voltage steps matches the three base-emitter steps between the collectors and emitters of Q1 and Q2, two of which steps are also positive and one negative. Specifically, Q28 has its collector connected to the positive voltage bus and its base connected to the collecctor of compensation transistor Q13. A second transistor in the voltage control circuit, Q29, has its collector connected to the base of control transistor Q15 and its base connected to the emitter of the other compensation transistor Q14. A third control circuit transistor, Q30, is a PNP transistor connected as a diode with its collector-base tied to the emitter of Q29 and its emitter to the emitter of Q28.

A separate current source network is provided for the voltage control circuit. A primary current source I8 draws current from the junction of Q29 and Q30, while a secondary current source I9 supplies current to the base of Q15 and the collector of Q29. The value of I9 is half that of I8, forcing current equal to that of I9 to flow through Q28, Q29 and Q30. The voltage control circuit thus establishes a predetermined collector- emitter voltage for the compensation transistors, and also sets up a fixed bias for control transistor Q15.

The elements of the voltage control circuit are related to the remainder of the circuit as follows:

With compensation transistor Q13 and Q14 equal to half the area of Q1 and Q2, Q28 is matched with Q7 and Q10; Q30 is matched with Q9 and Q12; and the current through Q29 (which is approximately to I9) is matched with I1 in substantially the same ratio as the proportional matching of the area of Q29 to the area of Q8 and Q11. With the above conditions, the collector-base voltages of compensation transistors Q13 and Q14 will be the same as the collector-base voltages of Q1 and Q2 and a near exact bias current cancellation is achieved.

Figure 4:
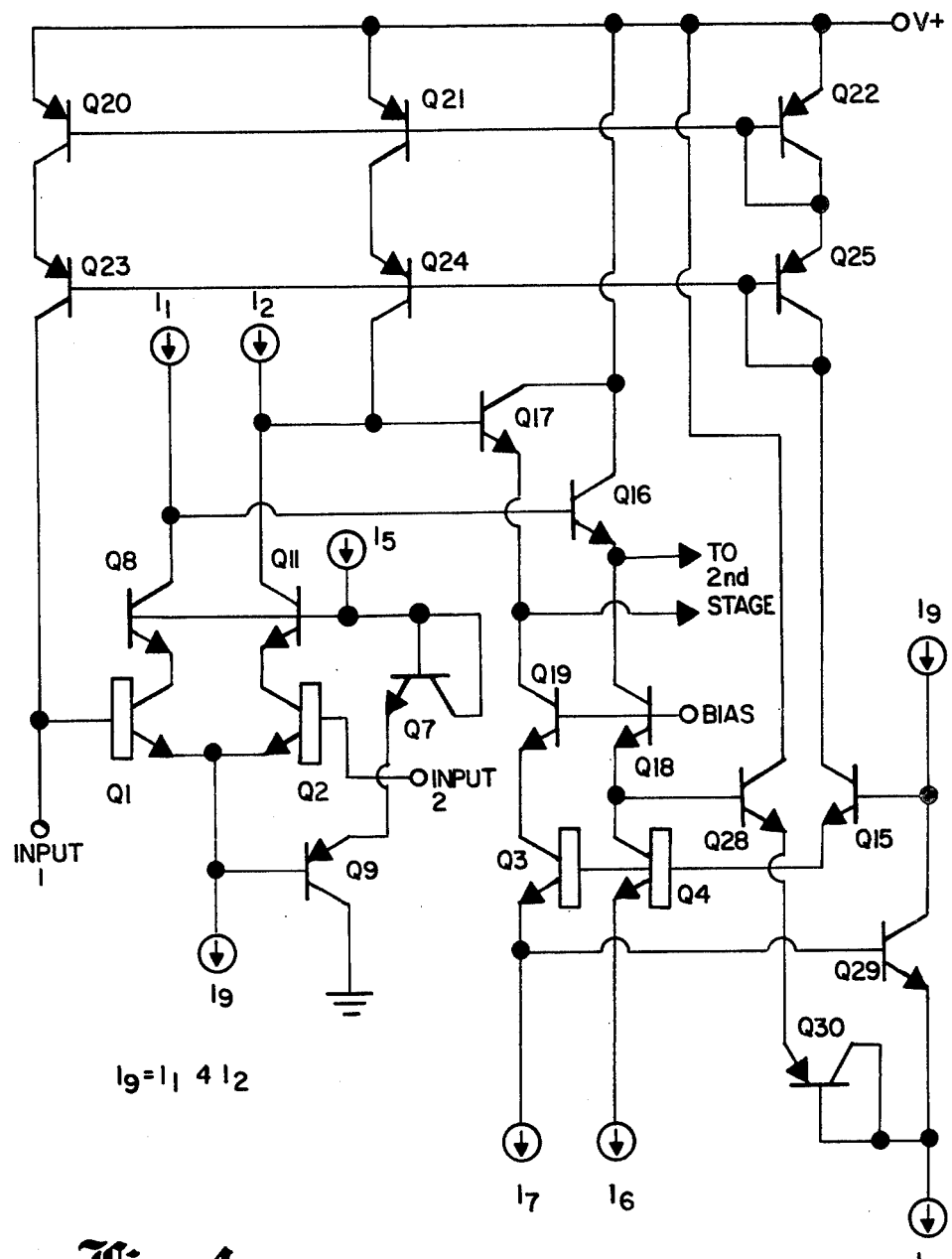
FIG. 4 is a schematic diagram of the input current compensation circuit of the present invention, as applied to an operational amplifier.

The invention may also be applied to an operational amplifier, as shown in FIG. 4. In this embodiment the two amplifier inputs aree equal, resulting in the need for one voltage limiting circuit Q7, Q8, Q9 . The other elements of the compensation circuit are the same as in FIG. 3, as is their operation.

While specific embodiment of the invention have been shown and described, various modifications and alternate embodiments will occur to those skilled in art. Accordingly, it is intended that the invention be limited only in terms of the appended claims.

I claim:

1. An input current compensation circuit for a dual branch amplifier having a superbeta transistor in each branch and input means connected to the base of each superbeta transistor, said circuit comprising:
   a current mirror connected to supply base current to each of the superbeta transistors,
   a pair of compensation transistors matched with the superbeta transistors and connected at their bases to drive the current mirror to deliver base compensation currents to the superbeta transistors which are matched with the base currents of the compensation transistors, means for driving a current through the compensation transistors to generate base currents therein for driving the current mirror, a control transistor having its collector-emitter circuit connected in circuit with the compensation transistors to supply base current thereto, and a voltage control circuit connected in circuit with the compensation transistors and control transistor to maintain the collector-emitter voltages of the compensation transistors at a level independent of the base-emitter voltage of the control transistor, and thereby eliminate variations in the compensation current due to variations in the base-emitter voltage of the control transistor.

2. The input current compensation circuit of claim 1, said voltage control circuit comprising a first transistor having its base-emitter circuit connected in circuit with the collector of one of the compensation transistors, a second transistor having its base-emitter circuit connected in circuit with the emitter of the other compensation transistor, a third transistor connected between the first and second transistors, and current source means establishing a current flow through the voltage control circuit sufficient to hold the collector-emitter voltages of the compensation transistors at a level equal to the voltage across the third transistor plus any difference between the base-emitter voltages of the first and second transistors.

3. The input current compensation circuit of claim 1, said voltage control circuit comprising a multi-transistor circuit connected across the compensation transistors, and a current directing a predetermined current through said transistor circuit to establish a predetermined voltage drop across the compensation transistors.

4. An input current compensation circuit for a dual branch amplifier of the type having a superbeta transistor in each branch, input means connected to the base of each superbeta transistor, a multi-transistor voltage limiting circuit connected to limit the collector-base voltages of the superbeta transistors, said voltage limiting circuit including a transistor connected in series with each superbeta transistor, first current source means connected to supply current to each of the superbeta and series connected transistors, second current source means connected to the bases of the series connected transistors, a current mirror connected to supply base current to each of the superbeta transistors, a pair of compensation transistors matched with the superbeta transistors and connected at their bases to drive the current mirror to deliver base compensation currents to the superbeta transistors, and circuit means connected to divert current from the first current source means to the compensation transistors to compensate for the base currents of the series connected transistors, the improvement comprising:

a multi-transistor voltage control circuit connected across the compensation transistors to control the collector-emitter voltages of the compensation transistors, said voltage control circuit being matched with the voltage limiting circuit, and third current source means matched with the second current source means and connected to induce a current flow through the voltage control circuit such that the collector-base voltages of the superbeta and compensation transistors are substantially equal, thereby substantially cancelling the amplifier's input current.

5. The input current compensation circuit of claim 4, wherein each of the transistors in the voltage control circuit is matched with a respective transistor in the voltage limiting circuit.

6. The input current compensation circuit of claim 4, said voltage control circuit being connected from the collector of one compensation transistor to the emitter of the other compensation transistor.

7. The input current compensation circuit of claim 6, said voltage control circuit comprising a first transistor having its base-emitter circuit connected in circuit with the collector of one of the compensation transistors, a second transistor having its base-emitter connected in circuit with the emitter of the other compensation transistor, and a third transistor connected between the emitters of the first and second transistors.

8. The input current compensation circuit of claim 7, said third source means establishing a current through said second transistor which is matched with the first current source means in substantially the same ratio as the proportional matching between the second transistor and the series connected transistors of the voltage limiting circuit.

9. The input current compensation circuit of claim 8, further comprising a control transistor having its collector-emitter circuit connected to provide bias current to the compensation transistors from the current mirror, said control transistor being biased by said second transistor.

10. The input current compensation circuit of claim 8, said third current source means comprising a primary current source connected between the second and third transistors to draw current from the voltage control circuit, and a secondary current source connected to supply current to the primary current source through the collector-emitter circuit of the second transistor.

11. The input current compensation circuit of claim 10, said primary current source having twice the current value of the secondary current source, thereby inducing substantially equal currents through each of the voltage control circuit transistors.

12. The input current compensation circuit of claim 8, said voltage limiting circuit for each superbeta transistor including said series connected transistor and a paid of additional transistors having their base-emitter circuits connected in series between the base of the series connected transistor and the emitter of each superbeta transistor, said second, first and third transistors being respectively matched with said series connected transistor and respective ones of said additional transistors.

13. An input current compensation circuit for a dual branch amplifier of the type having a superbeta transistor in each branch, input means connected to the base of each superbeta transistor, a multi transistor voltage limiting circuit connected to limit the collector-base voltages of the sueprbeta transistors, said voltage limiting circuit including a transistor connected in series with each superbeta transistor, first current source means connected to supply current to each of the superbeta and series connected transistors, second current source means connected to the bases of the series connected transistors, a current mirror connected to supply base current to each of the superbeta transistors, a pair of compensation transistors matched with the superbeta transistors and connected at their bases to drive the current mirror to deliver base compensation currents to the superbeta transistors, a control transistor having its collector-emitter circuit connected to supply current from the current mirror to the bases of the compensation transistors, and circuit means connected to divert current from the first current source means to the collector-emitter circuits of the compensation transistors to compensate for the base currents of the series connected transistors, the improvement comprising:

a multi-transistor voltage control circuit connected across the compensation transistors to control the collector-emitter voltages of the compensation transistors independent of the base-emitter voltage of the control transistor, said voltage control circuit being matched with the voltage limiting circuit, and third current source means matched with the second current source means and connected to induce a current flow through the voltage control circuit such that the collector-base voltages of the superbeta and compensation transistors are substantially equal, thereby substantially cancelling the amplifier's input current.

14. The input compensation circuit of claim 13, said voltage control circuit providing a bias for the control transistor.

15. The input current compensation circuit of claim 14, said voltage control circuit being connected from the collector of one compensation transistor to the emitter of the other compensation transistor.

16. The input current compensation circuit of claim 15, said voltage control circuit comprising a first transistor having its base-emitter circuit connected in circuit with the collector of one of the compensation transistors, a second transistor having its base-emitter circuit connected in circuit with the emitter of the other compensation transistor, and a third transistor connected between the emitters of the first and the second transistors.

17. The input current compensation circuit of claim 16, said third current source means establishing a current through said second transistor which is matched with the first current source means in substantially the same ratio as the proportional matching between the second transistor and the series connected transistors of the voltage limiting circuit.

18. The input current compensationcircuit of claim 17, said second transistor and third current source means comprising a bias circuit for said control transistor.

19. The input current compensation circuit of claim 17, said third current source means comprising a primary current source connected between the second and third transistors to draw current from the voltage control circuit, and a secondary current source connected to supply current to the primary current source through the collector-emitter circuit of the second transistor.

20. The input current compensation circuit of claim 19, the base of said control transistor being connected for biasing between said secondary current source and said second transistor.

21. The input current cancellation circuit of claim 17, said voltage limiting circuit for each superbeta transistor including said series connected transistor and a pair of additional transistors having their base-emitter circuits connected in series between the base of the series connected transistor and the emitter of each superbeta transistor, said second, first and third transistors being respectively matched with said series connected transistor and respective ones of said additional transistors.

* * * * *

UNITED STATES PATENT AND TRADEMARK OFFICE
CERTIFICATE OF CORRECTION

PATENT NO. : 4,471,321

DATED : September 11, 1984

INVENTOR(S) : Derek F. Bowers

It is certified that error appears in the above-identified patent and that said Letters Patent are hereby corrected as shown below:

In FIG. 4, delete the connection between the collector of Q24 and the base of Q17, and substitute a connection between the collector of Q24 and the base of Q2.

Signed and Sealed this

Fourteenth Day of April, 1987

Attest:

DONALD J. QUIGG

*Attesting Officer*  *Commissioner of Patents and Trademarks*